(12) United States Patent
Washburn et al.

(10) Patent No.: US 6,549,062 B1
(45) Date of Patent: Apr. 15, 2003

(54) METHOD AND APPARATUS FOR IMPROVING THE TOLERANCE OF INTEGRATED RESISTORS

(75) Inventors: Clyde Washburn, Victor, NY (US); Robert Bowman, Fairport, NY (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/994,083

(22) Filed: Nov. 21, 2001

(51) Int. Cl.[7] .............................................. H01L 35/00
(52) U.S. Cl. ...................................... 327/513; 327/565
(58) Field of Search ................................ 327/513, 407, 327/564, 565, 108

(56) References Cited

U.S. PATENT DOCUMENTS

| | | | | |
|---|---|---|---|---|
| 5,187,395 A | * | 2/1993 | Pirez ............................ 327/362 |
| 5,631,600 A | * | 5/1997 | Akioka et al. ............... 327/543 |
| 5,659,264 A | * | 8/1997 | Ariyoshi et al. ............. 327/513 |
| 6,111,437 A | * | 8/2000 | Patel ............................. 327/74 |
| 6,118,327 A | * | 9/2000 | Watarai ........................ 327/513 |
| 6,239,646 B1 | * | 5/2001 | Navabi et al. ............... 327/407 |
| 6,259,307 B1 | * | 7/2001 | Aram ........................... 327/513 |

* cited by examiner

*Primary Examiner*—Toan Tran
(74) *Attorney, Agent, or Firm*—Suiter & Associates

(57) ABSTRACT

A deice maximizes the allowable granularity of adjustment of a bus driver line characteristics by compensating for temperature variations by selecting components that have an opposite and approximately equal thermal coefficient. In the first aspect, component parts may be made smaller because their tolerances need not be made so precise. In the second aspect, duplicating the circuitry with matching characteristics allows one circuit to be operational while the other circuit is tested or dormant. Switching between the two circuits is performed seamlessly with no interruption of device operation.

41 Claims, 9 Drawing Sheets

| B0 | L | L | L | L | H | H | H | H |
|----|---|---|---|---|---|---|---|---|
| NG | L | L | H | H | L | L | H | H |
| PG | L | H | L | H | L | H | L | H |
| YA | H | H | H | H | L | H | L | H |
| AA | L | L | L | L | L | L | H | H |
| X | High Z | High Z | High Z | High Z | H | High Z | Intermediate voltage | L |

FIG. 4

METHOD AND APPARATUS FOR IMPROVING THE TOLERANCE OF INTEGRATED RESISTORS

FIELD OF THE INVENTION

The present invention generally relates to the field of integrated circuits, and particularly to a bus driver having temperature compensated circuitry that varies the resistance presented to the bus line.

BACKGROUND OF THE INVENTION

The Universal Serial Bus (USB) is an industry standard for a cable bus that supports data exchange between a host computer and one or more peripherals. It provides for connection of a personal computer to a data communications line and may be used for port expansion. The major goal of USB was to define an external expansion bus, easy to use and low in cost, which makes adding peripherals to a personal computer as easy as hooking up a telephone to a wall-jack. The external expansion architecture highlights PC host controller hardware and software, robust connectors and cable assemblies, peripheral friendly master-slave protocols, and expandibility through the use of multi-port hubs.

The USB standard, version 2.0, specifies a differential output driver to drive the data signal onto the USB cable at a data rate of 480 Mbps, 40 times faster than USB 1.1 devices. Certain connections for USB 2.0 remain at USB 1.1 data rates, e.g., 12 Mb/sec automatically downshifting to 1.5 Mb/sec for low-speed peripherals. To permit communication with USB 1.1 peripherals, USB 2.0 hubs contain a mechanism that supports data rate matching with the attached peripheral. Any downstream port of a USB 2.0 hub can support attachment of any speed USB device. The USB specifications present challenges to the circuit implementation, especially in CMOS area. The output voltage swings between the two single-ended outputs of a USB driver should be complementary. Furthermore, the output swings between differential high and low should be well balanced, i.e., ±10% matching on a signal transition and have a controlled slew rate in order to minimize signal skew, the radiated noise, cross talk and common mode reflection.

The USB version 2.0 is a backwards-compatible extension of the USB 1.1 specification. It uses the same cable, connectors, and software interfaces as USB 1.1, but it also permits the addition of higher performance peripherals, such as video-conferencing cameras may be connected to the bus because of its higher bandwidth, higher speed and higher resolution printers and scanners may be connected to the bus. High density storage devices such as R/W DVD and high capacity CD ROM jukeboxes may also be connected to the USB 2.0 bus. In the worst case, minor modifications may be required in the peripheral interface.

Some specifications, including USB 2.0, require tighter tolerance on termination resistors that a given process is able to attain initially due to process variation, or to maintain due to the effects of voltage and/or temperature changes.

Previously, devices interrupted the operation of the device, either during initialization and/or normal operation, to measure the termination resistance and make corrections or preset the terminating resistance using an external precision resistor. It is problematic to have the operation of the device interrupted in such a manner or require the use of external components.

Therefore, it would be desirable to provide an electronically controlled resistance termination changer which operates over an extended temperature range, which continues to operate during the course of termination resistance adjustment, and which has good granularity.

SUMMARY OF THE INVENTION

Accordingly, the present invention is directed to improve the matching characteristics of a bus driver line.

In a first aspect of the present invention, a electronic circuit arrangement for maintaining a given voltage for a given current over an extended temperature range has a first component having a non-zero thermal coefficient of a first polarity and a first magnitude, and a second component having a non-zero thermal coefficient of a second polarity and being of a second magnitude essentially equal to the first magnitude, the second polarity being opposite in sign to the first polarity.

In a second aspect of the present invention, a bus driver circuit has a plurality of sets of switchable subcircuits, each of the sets of switchable subcircuits having an output, the outputs of all the switchable subcircuits being combined to form a single driver bus line, wherein each of the switchable subcircuits contains two subcomponents which have thermal coefficients which are approximately equal in magnitude but opposite in sign.

In a third aspect of the invention, a bus driver circuit has a plurality of sets of switchable subcircuits, each of the sets of switchable subcircuits having an output, the outputs of all the switchable subcircuits being combined to form a single driver bus line, in which each of the plurality of sets of switchable subcircuits contains a differing number of switchable subcircuits.

The present invention describes a method of maintaining one or more terminations within a smaller tolerance window than PVT (process, voltage, temperature) would normally permit. The present invention pairs a resistor and a transistor to work in a stable temperature operation over an extended temperature range. This is achieved through the use of the resistor and the transistor each having a non-negligible temperature coefficient of resistance, equal and opposite in sign to one another, reducing the total variability.

The present invention offers two levels of improved efficiency. In the first level, component parts may be made smaller because their tolerances need not be made so precise. In the second level, duplicating the circuitry with matching characteristics allows one circuit to be operational while the other circuit is tested or dormnant. Switching between the two circuits is performed seamlessly with no interruption of device operation.

The present invention uses fewer adjustment bits and minimizes the temperature control range. A $\frac{1}{10}$ granularity is provided.

In the present invention, multiple terminations may be trimmed by the same control circuitry, to different tolerances.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 4 illustrates a logic table corresponding to the functionality of the top half of the circuitry of FIG. 3;

DETAILED DESCRIPTION OF THE INVENTION

Figure 1:
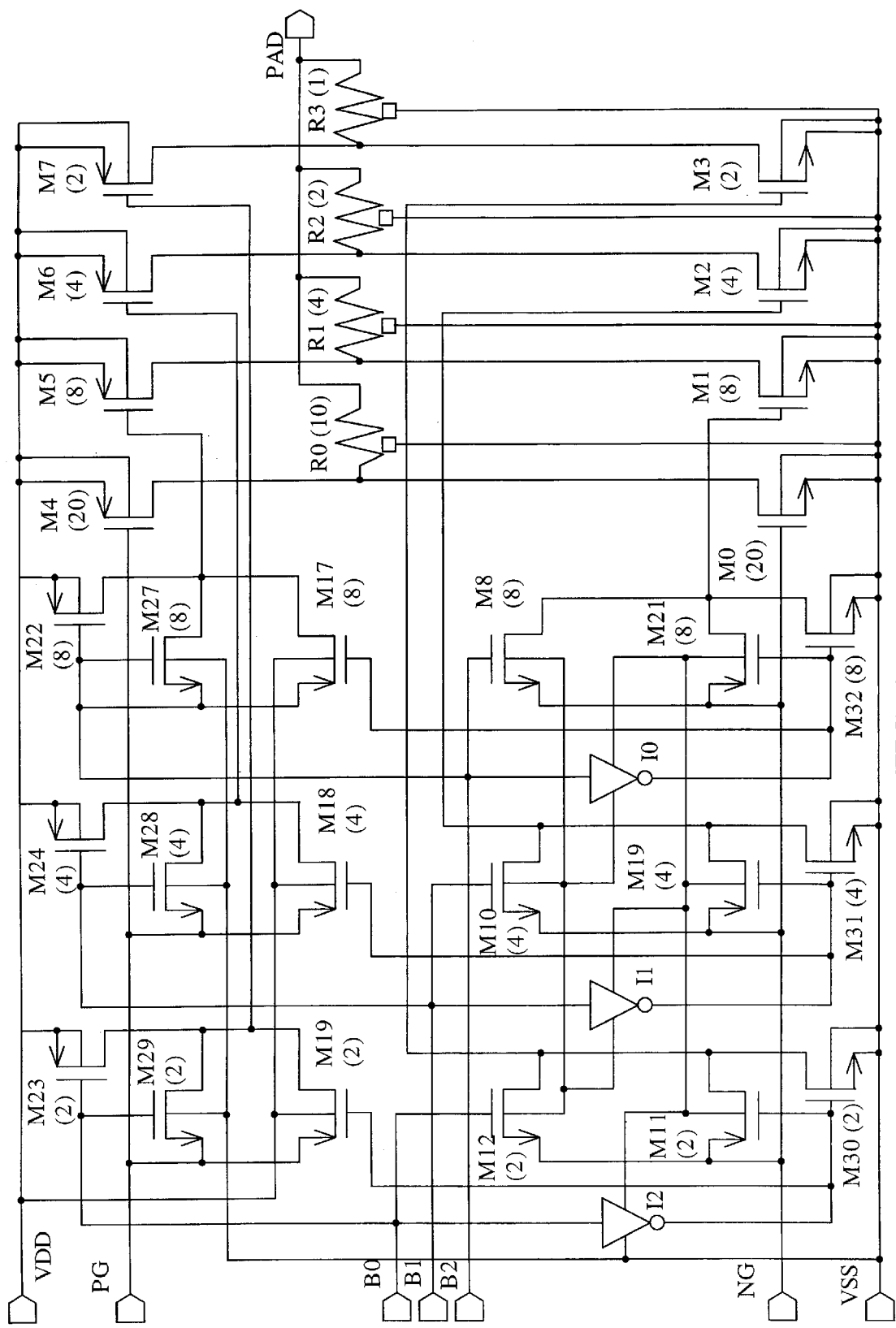
FIG. 1 illustrates a bus driver circuit of the present invention.

Reference will now be made in detail to the presently preferred embodiments of the invention, examples of which are illustrated in the accompanying drawings.

Referring generally now to FIGS. 1 through 8G, exemplary embodiments of the present invention are shown.

Computer data communication systems are signal transmission systems. When transmission lines are used, there are concerns about maintaining the integrity of the signal being transmitted. Signal transmissions between a computer and its peripheral devices which communicate with one another via a signal transmission line are terminated in a resistance close to the characteristic impedance of the transmission line, thereby suppressing reflections at its terminating ends and achieving high signal transmission speeds.

Many small computer systems are quite expandable. This means that various "add on" modules or printed circuit boards can be plugged into or electronically switched onto the computer bus, creating new "ends" of the bus. For example, many computer buses are "daisy chained" through a large number of plugged in modules. Computer bus conductors, such as USB bus conductors, need to be terminated by corresponding termination resistors which match the characteristic impedance of the bus conductors to avoid undesired signal-degrading reflections at the ends of the bus conductors. Therefore it often is desirable to provide termination resistors that can be connected under electronic control to each bus conductor or disconnected under electronic control from each bus conductor. This allows proper termination of the opposite ends of each bus conductor as the location of such ends change due to reconfiguration of the system by adding various modules and/or removing thereof from the USB bus.

In a bus system, high-speed signal transmission is made possible because of matched terminal resistance. The present invention relates to electronically controlled active bus terminators that controllably connect termination resistors to and disconnect them from corresponding computer bus conductors, and more particularly, to improved bus terminator circuitry that presents very low capacitance to the bus conductors when the termination resistors are electronically disconnected from the corresponding bus conductors. It also provides the thermal coefficient between two component elements are offset with respect to one another so as to cancel their change in voltage over an extended temperature range for a fixed current value, thereby enhancing device performance.

A common USB bus termination is 45 ohms. In USB 2.0, there is a 90 ohm balanced cable termination. The Thevenin equivalent of this may be implemented by a set of parallel resistances in an active bus termination circuit. The methodology begins by maximizing the allowable granularity of adjustment by reducing, to the extent possible, the temperature coefficient of resistance. Since to adjust resistance, switching devices are required, it is the teaching of this invention that the relationship between the properties of the resistor and switch be fixed, so that once an optimum combined temperature coefficient is obtained all resistors used for termination or calibration will have the same characteristic.

FIG. 1 illustrates a USB, version 2.0, bus driver termination resistance control circuit. The switched parallel resistances are turned on and off at the ends of the USB bus. When the switches controlling the resistances are turned off, the termination resistors are electronically disconnected from the corresponding bus conductors. This preserves the characteristic impedance of the bus and reduces system power dissipation.

The number of the parts in the circuit are designated within parentheses. For example, transistors M23 are two in number while resistor R0 is ten in number. Resistors R0, R1, R2, and R3 may be N doped polysilicon resistors, may have nine contacts, and/or may have nominal values of 507 ohms.

Figure 5:
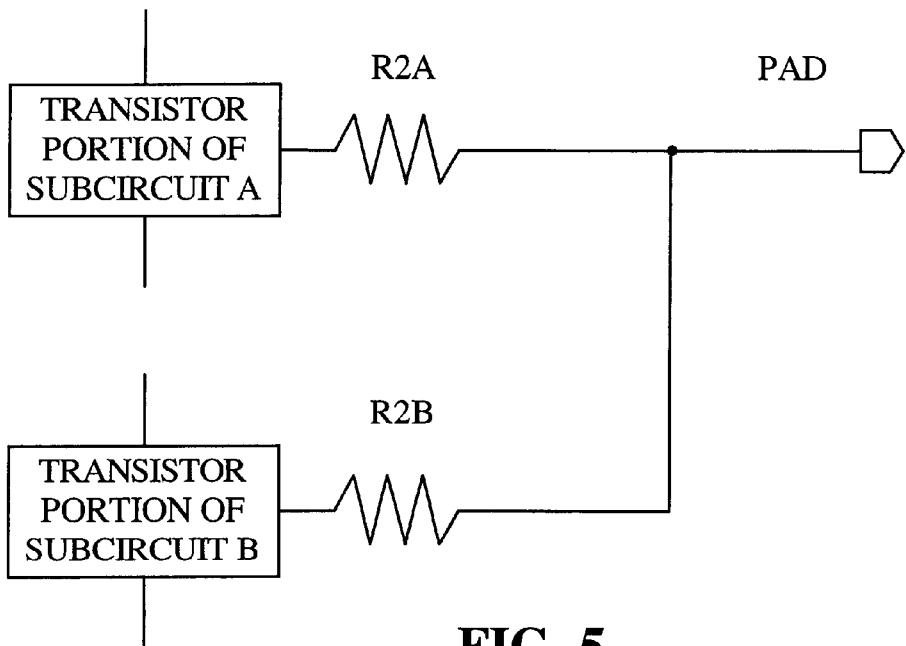
FIG. 5 illustrates the two subcircuits controlled by bit B1 of FIG. 1 according to the present invention.

FIG. 5 illustrates two subcircuits wire ANDed at point PAD. These two subcircuits are controlled by bit B1.

Each of the terminations required is constructed to the maximum extent possible of equal value resistors and switches, in series or parallel groups, forming the required maximum value and binary weighted shunts which allow the minimum value to be attained in a progression of binary-coded steps. FIG. 1 illustrates a complementary CMOS output drive constructed in this way which may be configured for a specific output impedance within a specific tolerance.

Figure 3:
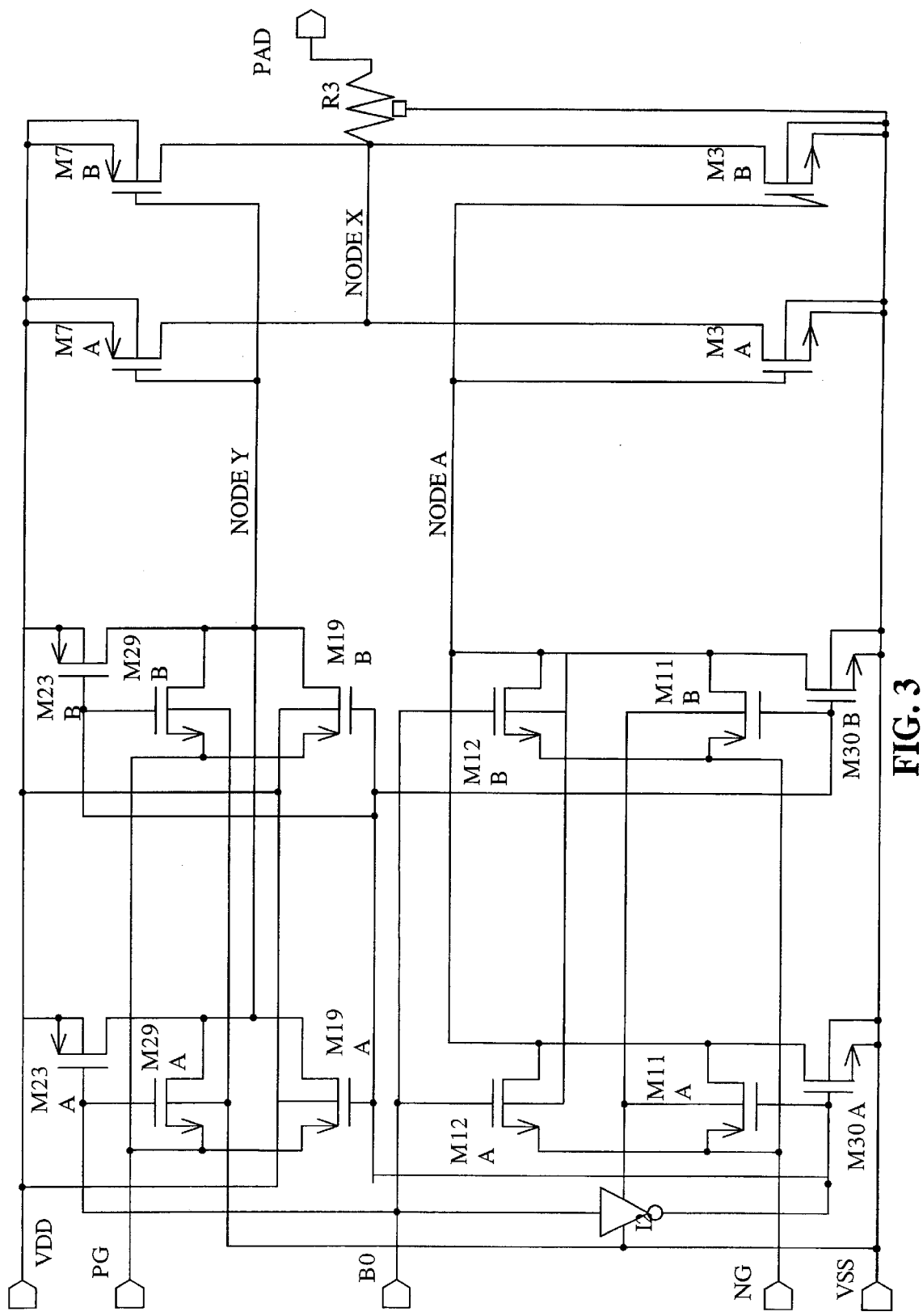
FIG. 3 illustrates bit B0 circuitry for driving a single one of the resistors wire anded to form output PAD.
Figure 7:
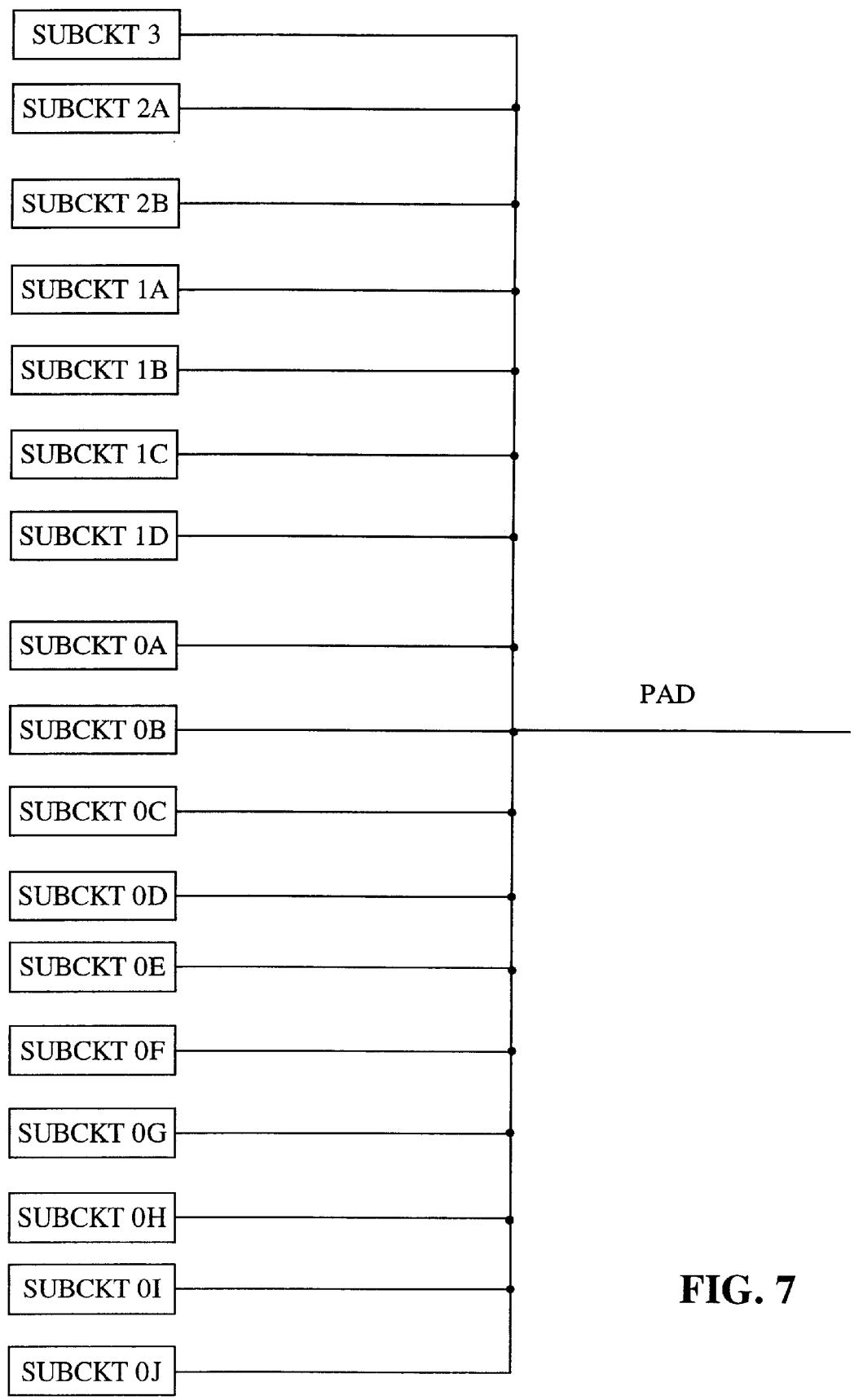
FIG. 7 illustrates a rearrangement of FIG. 1 to show the subcircuits according to the present invention.
Figure 8A:
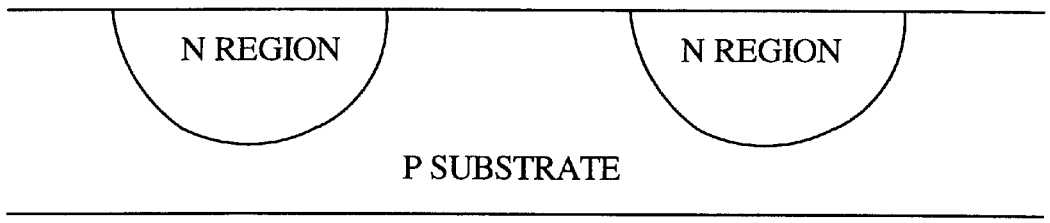
FIGS. 8A–8G illustrate processing steps for forming the circuitry of the present invention.
Figure 8B:
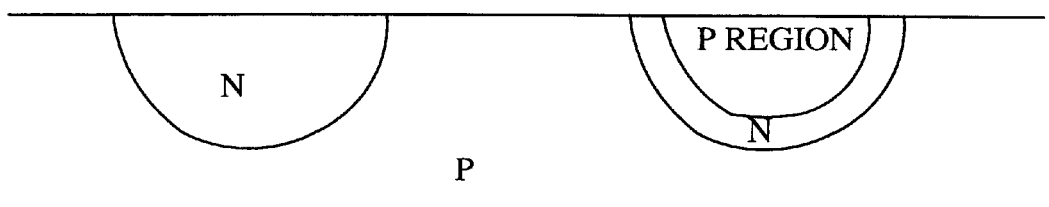
Figure 8C:
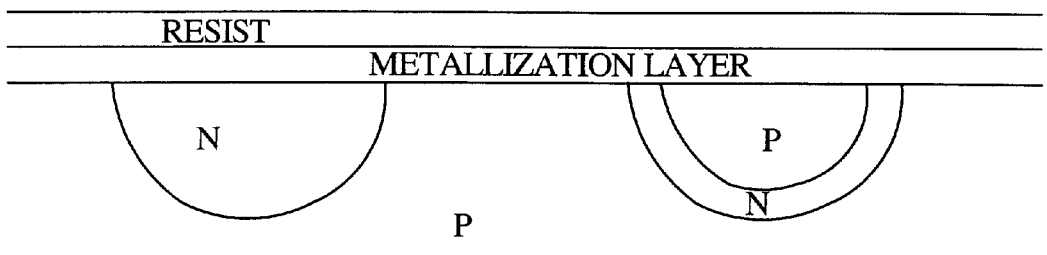
Figure 8D:
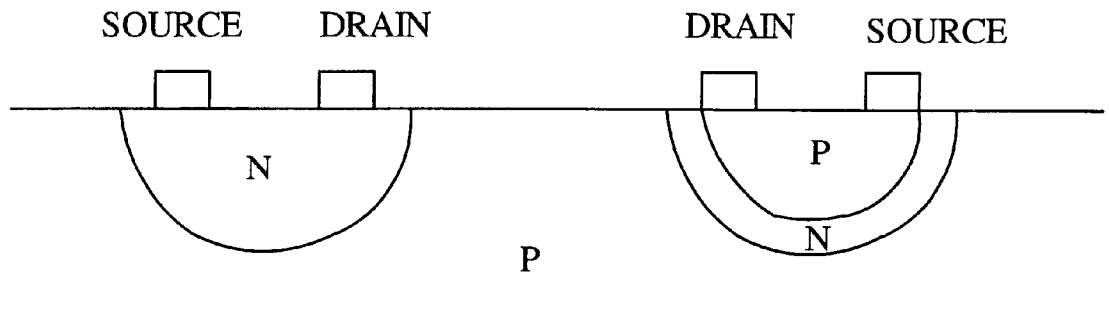
Figure 8E:
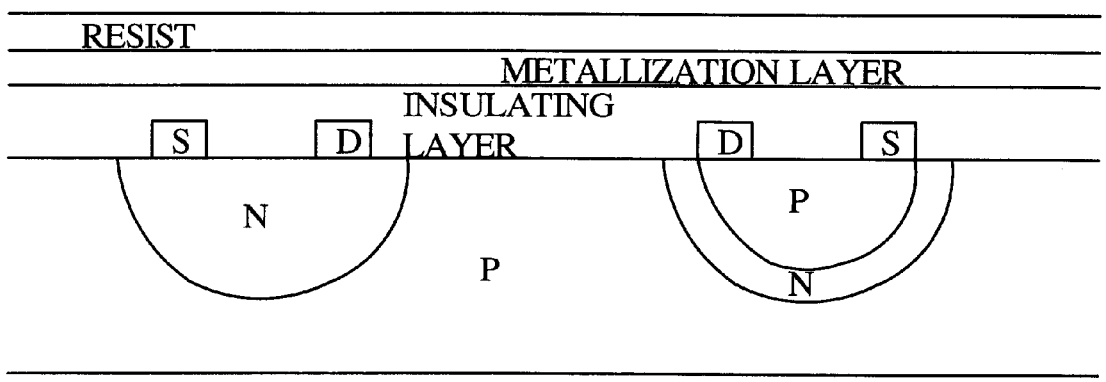
Figure 8F:
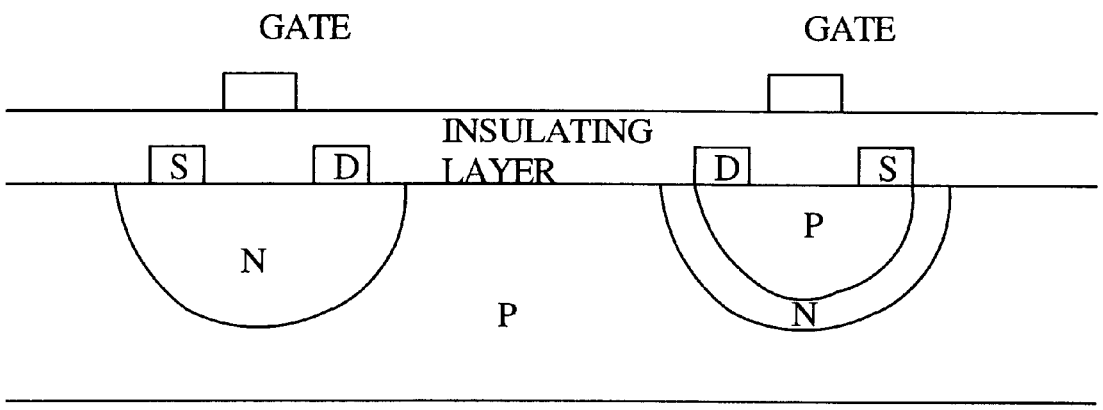
Figure 8G:
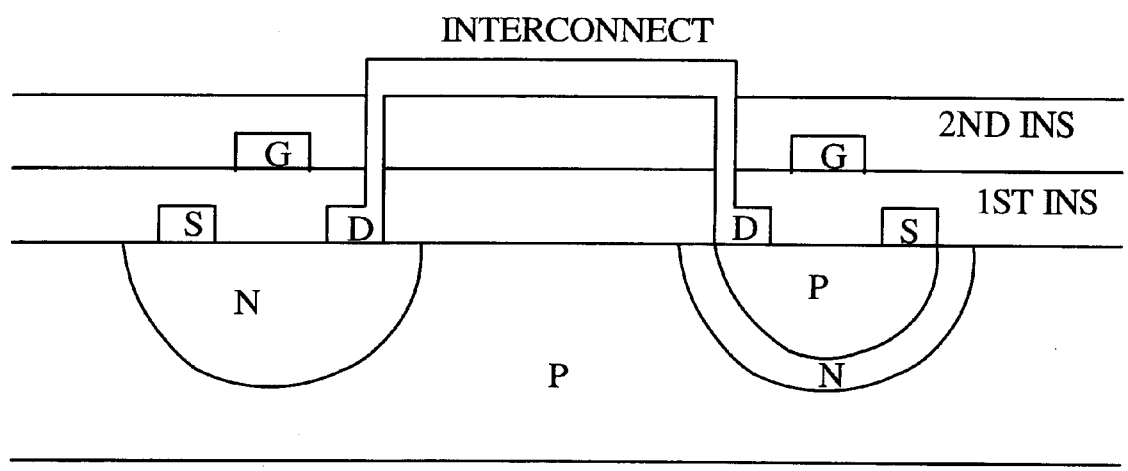

FIG. 1 is redrawn in FIG. 7 to better illustrate the individual subcircuits. Each subcircuit is configured as shown in FIG. 3.

Figure 6:
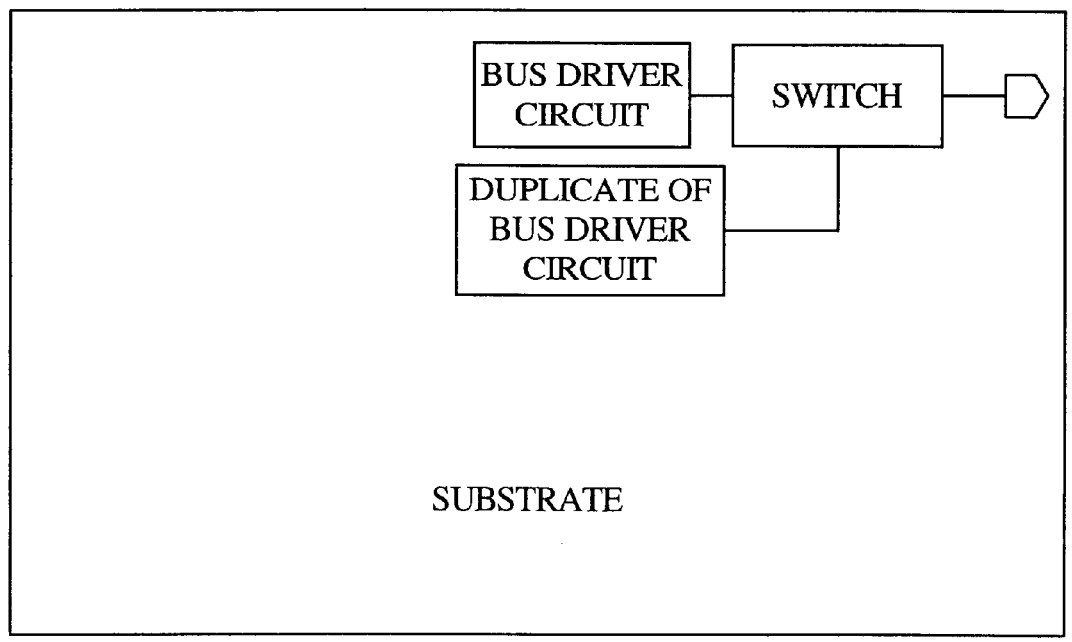
FIG. 6 illustrates the circuit of FIG. 1 and a duplicate circuit according to the present invention.

The circuit of FIG. 1 is duplicated. This is preferably done on the same substrate, as shown in FIG. 6. The two circuits having been formed in proximity and from the same processing should have nearly identical performance characteristics or performance characteristics which have a reliable and scalable relationship to each other. Each circuit acts as a surrogate for the other. The surrogate to actual array matching is acceptable under the known process statistics.

The surrogate device physically measures the resistance. Measurement of resistance may be accomplished by various means. Switching circuitry at the output of the two circuits enable either one to be attached to the bus and the other to be optionally connected to testing equipment to determine the current resistance characteristics. Because of the matching of circuit elements, a smaller number of control bits are needed.

Normal operation then consists of measurement of the resistance of the surrogate device, such as by passing a current through it and comparing the resulting voltage drop to that of a known voltage source (such as a bandgap reference), and adjusting the current in the surrogate via a binary coded current source such that the measured voltage is within an acceptable tolerance of the reference, as determined by one or more comparators. This would typically be accomplished by using the comparator outputs to establish whether the binary word applied to the current generator requires increment or decrement to reach the acceptable window, and causing a bi-directional counter to be so incremented/decremented. This testing may employ a feedback loop which measures the current to determine the output resistance of the other circuit, the assumption being that two circuits formed simultaneously in proximity and in the same process are going to have nearly identical performance characteristics. This feedback or calibration loop allows changes to be made. When the current reaches a value that places the voltage in the window, the counter remains static until the properties of the surrogate change in a way that moves the voltage outside the window again. Because the two circuits are formed in a similar manner within proximity to each other, the tolerances of the resistors and transistors need not be so high. Thus, the resistors and transistors may be made smaller than they would be otherwise.

Note that by control of the clock frequency and temporal position of the clock edge the times at which the resistor state can be changed may be controlled, and this would typically be a slow rate, since resistor changes are not normally rapid, and at a time when disturbances to the supplies are executed to be at a minimum.

In FIG. 1, the binary word represented by bits B0, B1 and B2, along with control signals PG and NG determine the resistance presented at the output node PAD. There is one subcircuit associated with bit B0, two subcircuits associated with bit B1, and four subcircuits associated with bit B2. Every subcircuit controlled by one of the binary word bits has two pairs of paired parallel NMOS and PMOS transistors which provide a common drain path to a corresponding output transistor.

Multiple terminations may be trimmed by the same control circuitry, to different tolerances. The resulting binary word applied to the current source to cause the voltage to reach the desired range is now also applied to the termination resistor arrays' binary trim bits, which causes the net value of those resistors to be controlled within the same tolerance as the voltage was controlled by the control loop described above. The trimming may be allowed to be continuously active without disruption of the signal paths, and the time at which discrete termination changes can occur may be chosen to minimize the chance of error due to extraneous signals or noise and/or coincide with data states that will be least affected.

For example, for B0, which drives the fewest subcircuits, one of its two subcircuits has a parallel NMOS-PMOS multiplexer transistor combination M19 and M29 and a disabling PMOS transistor M23 and a parallel NMOS-PMOS transistor combination M11 and M12 and a disabling NMOS transistor M30. The subcircuit is enabled by bit B0 and one of four operational modes are selected by signals NG and PG. An inverter USB inv 12 provides the inversion of bit B0 within the multiplexers.

Note that if any of the resistor terminator arrays may have less accurate adjustment than one or more Least Significant Bits (LSBs) may be dropped, proportionally reducing the array size and increasing the adjustment granularity of that terminator by one octave for each bit dropped. Two different value resistors need to be within a tight tolerance and a third resistor may have a looser tolerance (doubled). In the subject design, there are three arrays, two of which are trimmed to within +/-5% tolerance, while the third has a bit dropped and trims to +/-10% tolerance.

Figure 2:
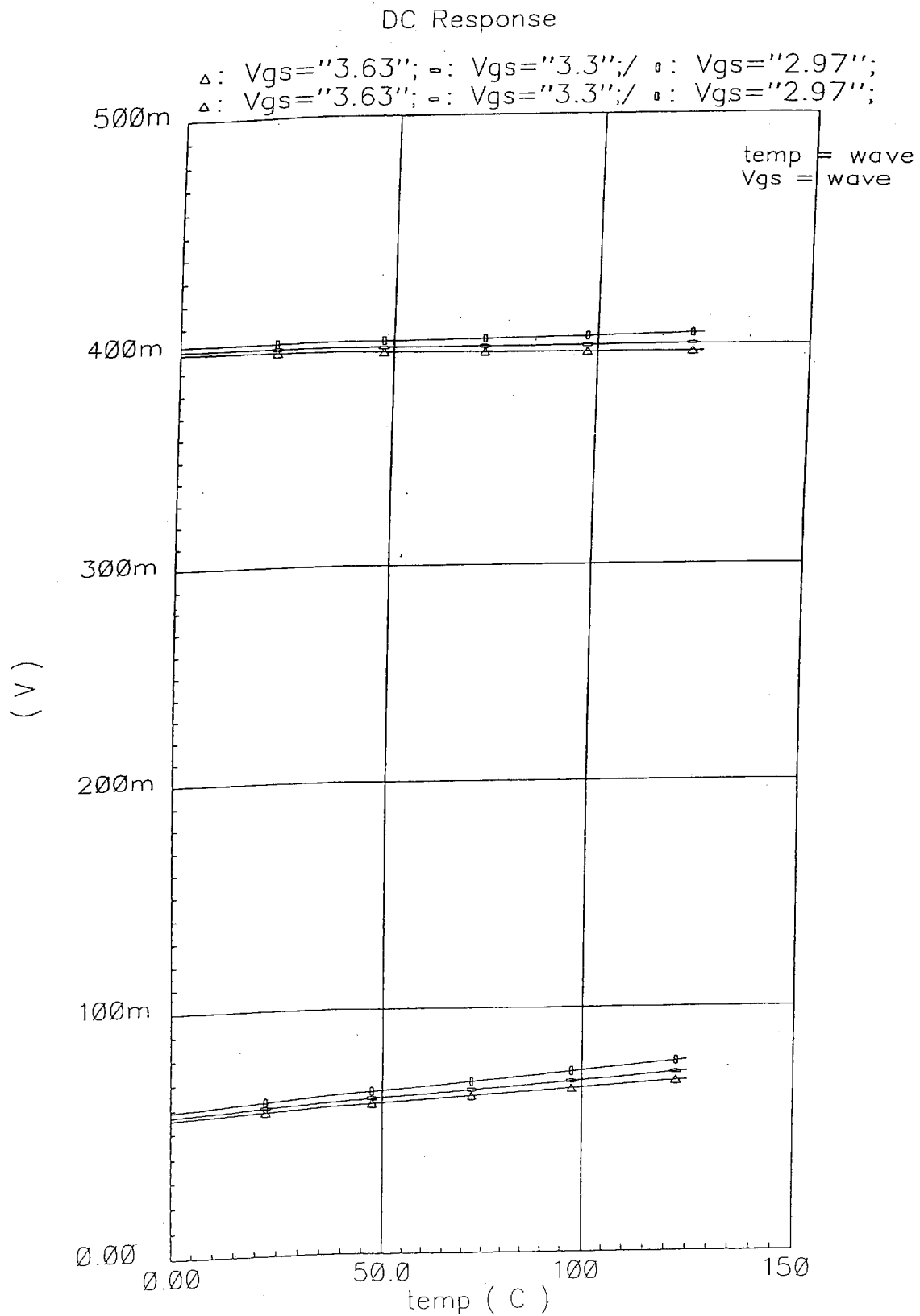
FIG. 2 illustrates a voltage over temperature graph for the series of a resistor and transistor pair of the present invention.

FIG. 2 shows an example of the optimization of the voltage over temperature performance of a resistor—transistor pair having offsetting thermal coefficients of resistance, where the upper trace shows the IR drop at constant current of a carefully sized resistance/FET switch pair, while the lower trace shows the contribution of the switch alone. The region between the upper and lower traces is the contribution of the resistor, and one can see that it cancels the slope of the switch. Since the change over temperature (and voltage) has been minimized, fewer steps of adjustment will be required than if large changes occurred due to both process variation and temperature/voltage. Note also that adjusting the FET switch size to allow it a significant TC (temperature coefficient) to offset that of the resistor alone reduces its size over the usual practice to attempting to make it a negligibly small resistance, which has a favorable impact on occupied die area. This efficiency may be possible if resistors opposite in TC sign are available in the target process.

FIG. 3 depicts the circuitry which is operated by bit B0 (i.e., a subcircuit). Signals PG and NG are provided to various transistors (labeled A and B). Signal PG is input to the sources of transistors M19 and M29. The signal NG is input to the gates of transistors M19, M11, and M30.

When bit B0 is a logic low, PG a logic low and NG a logic low, NMOS transistor M29 and PMOS transistor M19 are turned off and PMOS transistor M23 is turned on. The source voltage VDD, a logic high of transistor M23 appears at node Y. Because a logic high is present at the gate of PMOS transistor M7, transistor M7 is turned off. Similarly, NMOS transistor M12 and PMOS transistor M11 are turned off and NMOS transistor M30 is turned on. A logic low appears at node A, turning off NMOS transistor M3. Because both transistors M7 and M3 are turned off, point PAD0 sees a high impedance.

Similarly, when bit B0 is a logic low, regardless of the logic values of either signals NG or PG, output PAD0 is seen by a load to be a high impedance.

When bit B0 is a logic high, PMOS transistors M19 and M11 and NMOS transistors M29 and M12 turned on and PMOS transistor M23 and NMOS transistor M30 is turned off. Node Y sees the logic value of signal PG. Node A sees the logic value of signal NG. When PG is a logic low and NG is a logic low, PMOS transistor M7 is turned on and NMOS transistor M3 is turned off, driving X to a logic high. When PG is a logic high and NG is a logic low, node Y is a logic high and node A is a logic low, transistors M3 and M7 are both turned off, node X is in a high impedance state. When PG is a logic low and NG is a logic high, both transistors M3 and M7 are turned on, node X has a voltage set between VDD and VSS by the voltage division established by transistors M3 and M7. When PG is a logic high and NG is a logic high, node Y is a logic high and node AA is a logic high, transistor M7 is turned off and transistor M3 is turned off, driving node X to a logic low.

The signals NG and PG are generated by a processor. Bits B0, B1, and B2 control a different number of transistors.

In operation, signals PG and NG select the operational mode of several resistive output circuits. In one embodiment, there are seventeen resistive output circuits. As shown in FIG. 1, ten resistive output circuits are solely operated by signals PG and NG. When PG and NG are both logic level low, the resistive output circuits are all at logic level high. When NG is a logic low and PG is a logic high, the resistive output circuits are in a high impedance state. When NG is a logic level high and PG is a logic level low, a voltage somewhere intermediate VDD and VSS appears at each resistive output. When NG and PG are both logic level highs, all the associated resistive outputs of resistors R0 appear as logic level lows.

FIG. 4 depicts the logic for the circuit shown in FIG. 3.

Bit 0 controls one resistive output circuit, bit 1 controls two resistive output circuits, and bit 2 controls four resistive output circuits. Bits 0–2 act as enables for their resistive output circuits. If a bit is a logic level low, then its associated resistive output circuits are in high impedance states.

When a bit is a logic level high, it enables various modes of operation of its associated resistive output circuits. When PG and NG are both logic level low, the resistive output circuits are all at logic level high. When NG is a logic low and PG is a logic high, the resistive output circuits are in a high impedance state. When NG is a logic level high and PG is a logic level low, a voltage somewhere intermediate VDD and VSS appears at each resistive output. When NG and PG are both logic level highs, all the associated resistive outputs of resistors R1–R3 appear as logic level lows.

The resistive outputs are all wired AND together to generate output signal PAD. The resistive output circuits are parallel circuits. When only resistor R0 is operational, a circuit load sees a maximum impedance. This impedance is scalable according to which of the resistive output circuits are turned on. For the present embodiment, shown in FIG. 1, the different scale values possible are 10/11, 10/12, 10/13, 10/14, 10/15, 10/16, and 10/17 of the maximum impedance set at a value of 1. Other scaling values are possible as long as the values collectively provide for the desired gradations of impedance to match the transmission line impedance of the bus line.

This invention may be constructed in almost any common semiconductor process (MOS, CMOS, bipolar, etc.). An example of manufacture of two transistors is illustrated in FIGS. 8A to 8G. The NMOS (left side) and PMOS Field Effect Transistors (FETs) may be paired in various arrangements, including as inverters. The resistors R0, R1, R2, and R3 may be formed of polysilicon. I/O cells having a 5 V tolerance and having an inclusion of all terminations may be used. Any technique used to establish the resistance of the surrogate, and consequently how many resistors must be in the array to teach the desired value, would be in the scope and spirit of this invention.

It is believed that the method and apparatus for improving the tolerance of integrated resistors of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A bus driver circuit, comprising:
a plurality of sets of switchable subcircuits, each of the sets of switchable subcircuits having an output, the outputs of all the switchable subcircuits being combined to form a single driver bus line,
wherein each of the switchable subcircuits contains two subcomponents which have thermal coefficients which are approximately equal in magnitude but opposite in sign.

2. The bus driver circuit of claim 1, wherein each of the switchable subcircuits includes a resistor and two or more switching elements.

3. The bus driver circuit of claim 2, wherein the outputs of all the switchable subcircuits are combined to form a single output.

4. The bus driver circuit of claim 1, wherein the two subcomponents are a resistor and a switching element.

5. The bus driver circuit of claim 4, wherein the switching element is a field effect or bipolar transistor.

6. A bus driver circuit, comprising:
a plurality of sets of switchable subcircuits, each of the sets of switchable subcircuits having an output, the outputs of all the switchable subcircuits being combined to form a single driver bus line,
wherein each of the plurality of sets of switchable subcircuits contains a differing number of switchable subcircuits.

7. The bus driver circuit of claim 6, wherein each switchable subcircuit includes a resistor and two or more switching elements.

8. A method for optimizing transmission line switching characteristics, comprising:
forming first and second circuits using the same process at the same time, the first and second circuits being formed in close proximity to each other, the first and second circuits each having an output and having two or more input lines, the first and second circuits each having at least one resistor and at least one transistor paired together so that the at least one resistor and the at least one transistor have substantially equal magnitudes of opposite sign; and
forming output switching circuitry which receives the outputs of the first and second, circuits and which switches one of the outputs to a load while the other output is either connected to testing circuitry or is unconnected.

9. The method of claim 8, the first and second circuits being formed on a same substrate.

10. The method of claim 9, using one of the first and second circuits to drive the load.

11. The method of claim 10, while the one of the first and second circuits is being used to drive the load, testing at least one electrical characteristic of the other of the first and second circuits.

12. The method of claim 11, the load being a bus line.

13. The method of claim 12, the bus line being a USB bus line.

14. The method of claim 13, the USB bus line being a USB version 2.0 bus line.

15. The method of claim 11, the step of testing using a feedback loop which measures current to determine the output resistance.

16. The method of claim 11, further comprising adjusting the at least one electrical acteristic by selecting a bit word as input to the one of the first and second circuits which is being tested.

17. The method of claim 9, the substrate being a monolithic substrate.

18. The method of claim 8, the first and second circuits being scaled in relation to one another so that their outputs have electrical characteristics in a determinable relationship to one another.

19. The method of claim 18, the electrical characteristics being scaled as a multiple of the one of the first and second circuits to the other of the first and second circuits.

20. A method for optimizing transmission line switching characteristics, comprising:
forming first and second circuits using the same process at the same time, the first and second circuits being formed in close proximity to each other, the first and second circuits each having an output and having two or more input lines, the first and second circuits being scaled in relation to one another so that their outputs have electrical characteristics in a determinable relationship to one another; and forming output switching circuitry which receives the outputs of the first and second circuits and which switches one of the outputs to a load while the other output is either connected to testing circuitry or is unconnected.

21. The method of claim 20, wherein the first and second circuits each have at least one resistor and at least one transistor paired together such that the at least one resistor and the at least one transistor have substantially equal magnitudes of opposite sign.

22. The method of claim 21, wherein the first and second circuits are formed on a same substrate.

23. The method of claim 22, further comprising the step of using one of the first and second circuits to drive the load.

24. The method of claim 23, while the one of the first and second circuits is being used to drive the load, testing at least one electrical characteristic of the other of the first and second circuits.

25. The method of claim 24, wherein the load is a bus line.

26. The method of claim 25, wherein the bus line is a USB bus line.

27. The method of claim 24, further comprising the step of testing using a feedback loop which measures current to determine the output resistance.

28. The method of claim 24, further comprising adjusting the at least one electrical characteristic by selecting a bit word as input to the one of the first and second circuits which is being tested.

29. The method of claim 22, wherein the substrate is a monolithic substrate.

30. The method of claim 20, wherein the electrical characteristics are scaled as a multiple of the one of the first and second circuits to the other of the first and second circuits.

31. An electronic circuit arrangement for maintaining a given voltage for a given current over an extended temperature range, comprising:

a field effect transistor having a non-zero thermal coefficient of a first polarity and a first magnitude; and a resistor having a non-zero thermal coefficient of a second polarity and being of a second magnitude essentially equal to the first magnitude, the second polarity being opposite in sign to the first polarity, the field effect transistor and the resistor being electrically coupled at a node, the resistor being switchably capable of providing all or a portion of an output signal.

32. The electronic circuit arrangement of claim 31, wherein the field effect transistor is an NMOS field effect transistor.

33. The electronic circuit arrangement of claim 31, wherein the electronic circuit arrangement is part of a bus driver circuit.

34. A bus driver circuit, comprising:

a field effect transistor having a non-zero thermal coefficient of a first polarity and a first magnitude; and a resistor having a non-zero thermal coefficient of a second polarity and a second magnitude essentially equal to the first magnitude, the second polarity being opposite in sign to the first polarity, the field effect transistor and the resistor being electrically coupled at a node, the resistor being capable of switchably providing all or part of an output signal from the bus driver circuit.

35. The bus driver circuit of claim 6, wherein each switchable subcircuit includes a resistor and a transistor, each having a non-zero thermal coefficient of substantially the same magnitude but opposite in sign.

36. The bus driver circuit of claim 35, wherein the transistor is a field effect transistor.

37. The bus driver circuit of claim 36, wherein the field effect transistor is an NMOS field effect transistor.

38. The bus driver circuit of claim 6, further comprising a second plurality of sets of switchable subcircuits, the two pluralities of sets of switchable subcircuits being identical or nearly identical.

39. The bus driver circuit of claim 38, the two pluralities of sets of switchable subcircuits being formed in proximity to each other.

40. The bus driver circuit of claim 39, wherein either of the two pluralities of sets of switchable subcircuits is switchably connectable to drive a bus line load.

41. The bus driver circuit of claim 39 wherein at least one of the two pluralities of sets of switchable subcircuits is switchably connectable to a test circuit.

* * * * *